(12) United States Patent
Lee et al.

(10) Patent No.: US 11,429,234 B2
(45) Date of Patent: Aug. 30, 2022

(54) METHOD AND ELECTRONIC DEVICE FOR CORRECTING MEASUREMENT VALUE OF SENSOR

(71) Applicant: Samsung Electronics Co., Ltd., Suwon-si (KR)

(72) Inventors: Jeehoon Lee, Seoul (KR); Eungi Min, Suwon-si (KR); Yongjin Lee, Seoul (KR); Suho Lee, Suwon-si (KR); Sukwang Lim, Gwangmyeong-si (KR); Hyungjoon Lim, Seoul (KR); Seungeun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 145 days.

(21) Appl. No.: 16/759,121

(22) PCT Filed: Oct. 19, 2018

(86) PCT No.: PCT/KR2018/012409
§ 371 (c)(1),
(2) Date: Apr. 24, 2020

(87) PCT Pub. No.: WO2019/088529
PCT Pub. Date: May 9, 2019

(65) Prior Publication Data
US 2021/0034195 A1 Feb. 4, 2021

(30) Foreign Application Priority Data
Nov. 3, 2017 (KR) .................. 10-2017-0146045

(51) Int. Cl.
*G06F 3/044* (2006.01)
*G06F 3/041* (2006.01)
*H03K 17/96* (2006.01)

(52) U.S. Cl.
CPC .......... *G06F 3/0443* (2019.05); *G06F 3/0418* (2013.01); *H03K 17/962* (2013.01); *H03K 2017/9606* (2013.01)

(58) Field of Classification Search
CPC ...... G06F 3/0443; G06F 3/0418; G06F 3/044; H03K 17/962; H03K 2017/9606;
(Continued)

(56) References Cited

U.S. PATENT DOCUMENTS

2002/0060953 A1* 5/2002 Farine .................. G04G 21/08
368/69
2007/0164756 A1 7/2007 Lee
(Continued)

FOREIGN PATENT DOCUMENTS

CN 101375500 A 2/2009
CN 101900574 A 12/2010
(Continued)

OTHER PUBLICATIONS

Extended European Search Report dated Oct. 9, 2020, issued in European Patent Application No. 18873650.8.
(Continued)

*Primary Examiner* — Daniel R Miller
(74) *Attorney, Agent, or Firm* — Jefferson IP Law, LLP

(57) ABSTRACT

An electronic device according to various embodiments of the present invention may comprise: at least one electrode having conductivity; a capacitance sensor, at least one switch electrically connected between the at least one electrode and the capacitance sensor, and capable of selectively connecting the at least one electrode and the capacitance sensor; and a control circuit, wherein the control circuit measures a first capacitance value by using the capacitance sensor in a state where the at least one switch is open, measures a second capacitance value corresponding to an
(Continued)

external object contacting the at least one electrode, by using the capacitance sensor in a state where the at least one switch is connected, corrects the second capacitance value by using the first capacitance value, and determines the corrected second capacitance value as a capacitance value for the external object. Various other embodiments are possible.

13 Claims, 10 Drawing Sheets

(58) Field of Classification Search
CPC ........ H03K 2217/960705; H03K 2217/96073; H03K 2217/960745; G01R 27/26; G01R 35/007; G01R 27/2605
See application file for complete search history.

(56) References Cited

U.S. PATENT DOCUMENTS

| | | |
|---|---|---|
| 2009/0267922 A1 | 10/2009 | Umeda |
| 2010/0123667 A1 | 5/2010 | Kim et al. |
| 2010/0219840 A1 | 9/2010 | Motojima et al. |
| 2010/0302183 A1 | 12/2010 | Kogo et al. |
| 2014/0062947 A1 | 3/2014 | Zhou et al. |
| 2014/0176160 A1 | 6/2014 | Erkens |
| 2015/0205412 A1 | 7/2015 | Kim et al. |
| 2015/0234537 A1 | 8/2015 | Kusuda et al. |
| 2016/0057578 A1 | 2/2016 | Rouaissia et al. |
| 2016/0124573 A1 | 5/2016 | Rouaissia et al. |
| 2016/0154952 A1 | 6/2016 | Venkatraman et al. |
| 2017/0134022 A1 | 5/2017 | Kim et al. |

FOREIGN PATENT DOCUMENTS

| | | | |
|---|---|---|---|
| CN | 103404030 A | | 11/2013 |
| CN | 103677452 A | | 3/2014 |
| CN | 105892775 A | | 8/2016 |
| CN | 106990879 A | | 7/2017 |
| JP | 2006347215 A | * | 12/2006 |
| JP | 2009-265851 A | | 11/2009 |
| JP | 2017-120593 A | | 7/2017 |
| JP | 2017-156169 A | | 9/2017 |
| KR | 10-2010-0054275 A | | 5/2010 |
| KR | 10-2015-0087638 A | | 7/2015 |
| KR | 10-2015-0097395 A | | 8/2015 |

OTHER PUBLICATIONS

Pengjie Du, "Intelligent detection technology of smart bracelet", China Appliance Technology, vol. 12, 2016, p. 35-37.
Chinese Office Action dated May 25, 2022, issued in Chinese Patent Application No. 201880069801.X.

* cited by examiner

METHOD AND ELECTRONIC DEVICE FOR CORRECTING MEASUREMENT VALUE OF SENSOR

TECHNICAL FIELD

The disclosure relates to a method for correcting the measurement value of a sensor, and an electronic device therefor.

BACKGROUND ART

As technologies develop, various types of electronic devices, such as a personal digital assistant (PDA), an electronic notebook, a smart phone, a tablet personal computer (PC), and the like are being provided, and wearable devices that users can wear are being released.

Recently, an electronic device that provides various functions depending on whether the electronic device is in contact with a user is provided. For example, by taking into consideration an effect of electromagnetic waves emitted from an electronic device on a user, the electronic device may provide a function of controlling the output of the electromagnetic waves emitted from the electronic device, based on whether the electronic device is in contact with the user. A wearable device may provide a function of controlling a screen displayed on a display based on whether the wearable device is in contact with a user.

DISCLOSURE OF INVENTION

Technical Problem

An electronic device may determine whether an electronic device is in contact with a user, using various sensors. For example, the electronic device may determine whether the electronic device is in contact with the user using a resistive touch sensor, a capacitance sensor (capacitive sensor), a proximity sensor, or the like. Also, in order to accurately provide various functions to a user based on whether the electronic device is in contact with the user, the electronic device needs to accurately determine whether the electronic device is in contact with the user. For example, the electronic device may determine a reference sensor value which is used as a criterion for determining whether contact exists, and may determine that the electronic device and the user are in contact with each other if a sensor value greater than or equal to the reference sensor value is obtained. Alternatively, if a sensor value less than or equal to the reference sensor value is obtained, the electronic device may determine that the user and the electronic device are in contact with each other, and the criterion for determining whether contact exists may be set differently depending on the type of sensor or the like. According to the conventional method, an electronic device may determine whether contact exists based on a reference sensor value which is arbitrarily set by a user. However, since there is a difference in measurement of a sensor value for each electronic device, it is difficult to accurately determine whether an electronic device and a user are in contact with each other.

Solution to Problem

In accordance with an aspect of the disclosure, an electronic device may include: at least one electrode having conductivity; a capacitance sensor; at least one switch configured to be electrically connected between the at least one electrode and the capacitance sensor and configured to selectively connect the at least one electrode and the capacitance sensor; and a control circuit, wherein the control circuit is configured to: measure a first capacitance value using the capacitance sensor in the state in which the at least one switch is open; measure a second capacitance value corresponding to an external object which is in contact with the at least one electrode, using the capacitance sensor, in the state in which the at least one switch is connected; correct the second capacitance value using the first capacitance value; and determine the corrected second capacitance value to be a capacitance value for the external object.

In accordance with another aspect of the disclosure, a method of correcting a measurement value of a sensor of an electronic device may include: measuring a first capacitance value using a capacitance sensor, in the state in which at least one switch is open, the switch being capable of selectively connecting at least one electrode and the capacitance sensor; measuring a second capacitance value corresponding to an external object that is in contact with the at least one electrode, using the capacitance sensor, in the state in which the at least one switch is connected; correcting the second capacitance value using the first capacitance value; and determining the corrected second capacitance value to be a capacitance value for the external object.

In accordance with another aspect of the disclosure, a computer readable storage medium stores instructions, which are configured to enable at least one processor of an electronic device to perform at least one operation when the instructions are executed by the at least one processor, the at least one operation including: measuring a first capacitance value using a capacitance sensor in the state in which at least one switch is open, the switch being capable of selectively connecting at least one electrode having conductivity and the capacitance sensor of the electronic device; measuring a second capacitance value corresponding to an external object that is in contact with the at least one electrode, using the capacitance sensor, in the state in which the at least one switch is connected; correcting the second capacitance value using the first capacitance value; and determining the corrected second capacitance value to be a capacitance value for the external object.

Advantageous Effects of Invention

According to various embodiments, a reference sensor value which is a criterion for determining whether contact exists may be determined based on a measurement value obtained by a sensor, so that whether contact with a user exists can be accurately determined.

According to various embodiments, a reference sensor value which is a criterion for determining whether contact exists may be determined, irrespective of whether an external object (e.g., a finger, a hand, a wrist, or the like) is in contact with (e.g., touches, holds (grips), or wears) an electronic device, and thus, contact with a user (e.g., a state of wearing a wearable device on a wrist, a state of holding a mobile device, or the like) may be accurately determined.

MODE FOR THE INVENTION

Figure 1:
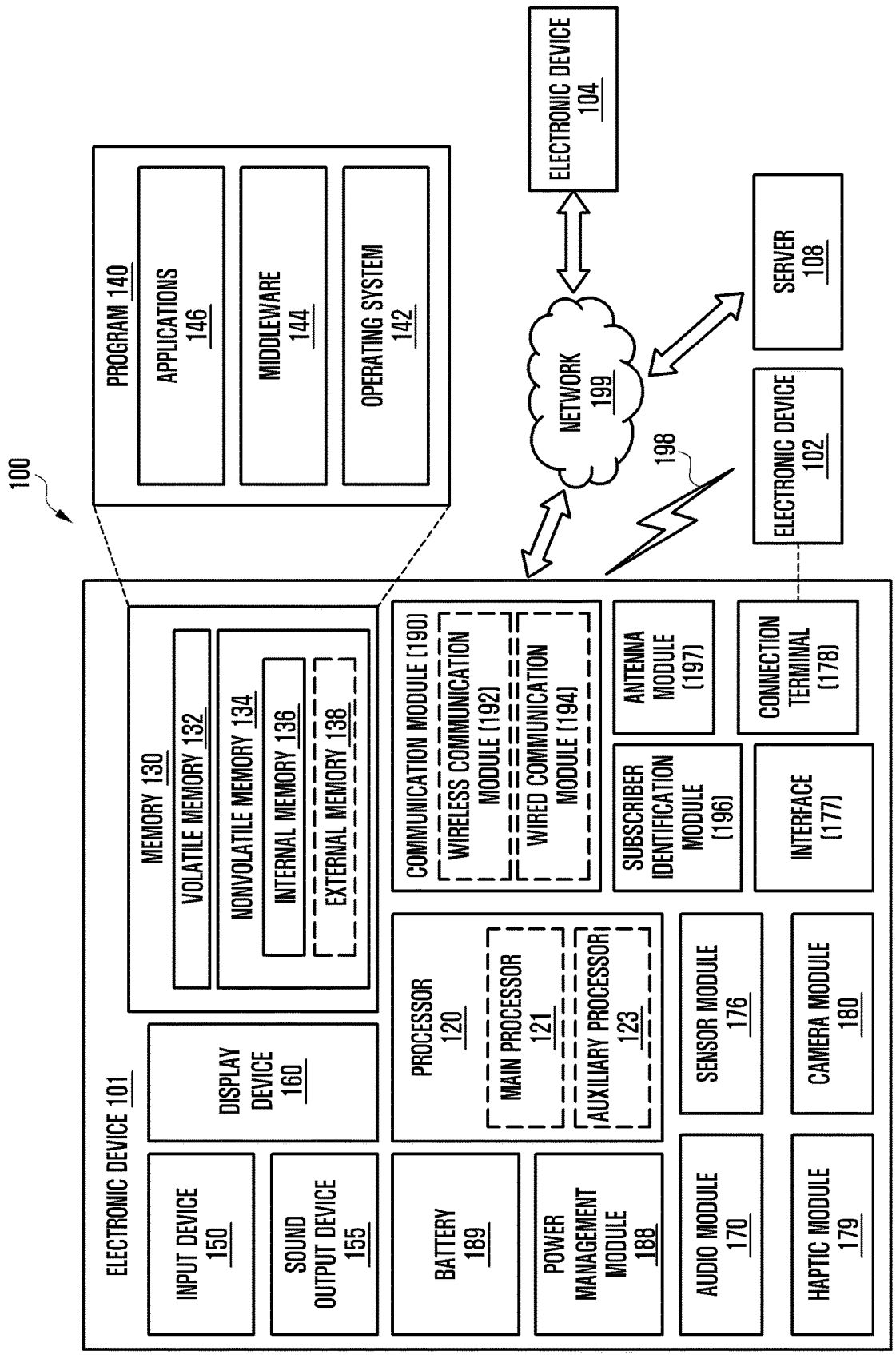
FIG. 1 is a block diagram of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation.

According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., over wires) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., over wires) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., a LAN or a wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device 101 according to various embodiments may be one of various types of electronic devices. The electronic devices may include, for example, a portable communication device (e.g., a smartphone), a computer device, a portable multimedia device, a portable medical device, a camera, a wearable device, or a home appliance.

According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., over wires), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
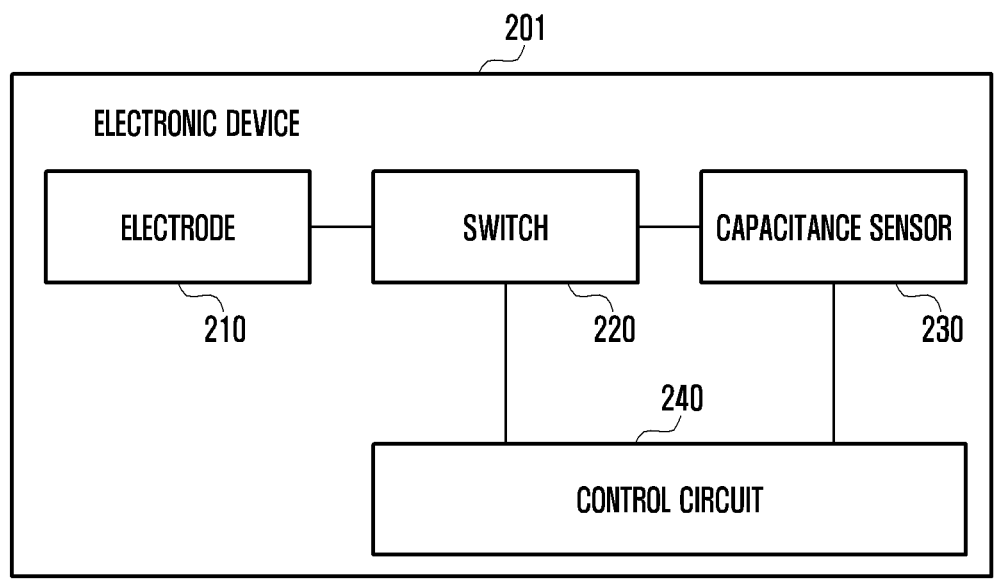
FIGS. 2A and 2B are block diagrams illustrating an electronic device according to various embodiments of the disclosure.
Figure 2B:
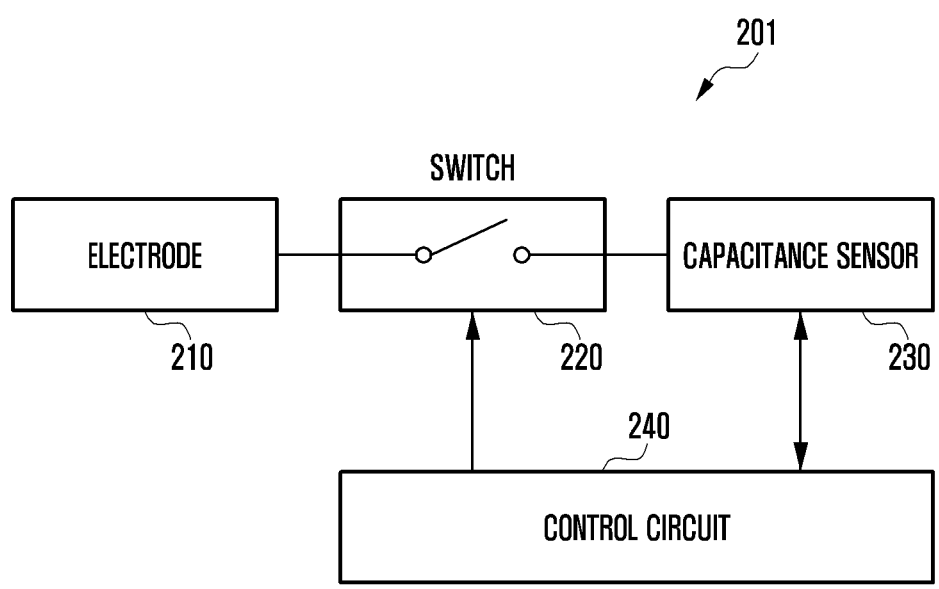

FIGS. 2A and 2B are block diagrams illustrating an electronic device according to various embodiments of the disclosure. According to various embodiments, an electronic device 201 may include the whole or a part of the electronic device 101 illustrated in FIG. 1.

Referring to FIG. 2A, the electronic device 201 may include an electrode 210, a switch 220, a capacitance sensor 230, and a control circuit 240. Although not illustrated in FIG. 2A, the electrode 210 and/or the switch 220 may be included as, for example, a component of the capacitance sensor 230. Although FIG. 2A illustrates that the electronic device 201 includes one electrode 210 and one switch 220, the disclosure is not limited thereto. The electronic device 201 may include a plurality of electrodes 210 and/or a plurality of switches 220.

According to various embodiments, the electrode 210 may transfer an electric signal to another component in the electronic device 201. The electrode 210, for example, may be disposed in a way that at least a part of the electrode 210 is exposed to the outside of the electronic device 201. For example, if an external object (e.g., a finger, a hand, a wrist, or the like) is in contact with (e.g., touches, holds (grips), or wears) the electrode 210, the electrode 210 may transfer an electric signal, transferred from another component of the electronic device 201, to the external object, and may transfer an electric signal, transferred from the external object, to another component of the electronic device 201. According to an embodiment, the electrode 210 may have a feature of inducing electric conduction (e.g., electro conductive). According to various embodiments, at least a part of the electrode 210 may be exposed through at least a part of a housing that forms the outer surface of the electronic device 201.

According to various embodiments, the switch 220 may be disposed between the electrode 210 and the capacitance sensor 230. The switch 220 may electrically connect or disconnect, for example, the electrode 210 and the capacitance sensor 230. The switch 220, for example, may be a switch that is capable of opening/closing an electric circuit, or is capable of changing a connection state. For example, the switch 220 may include a single-pole single-throw (SPST) switch. However, the disclosure is not limited thereto.

According to various embodiments, the capacitance sensor 230 may measure a capacitance value, based on an electric signal transferred from components included in the electronic device 201. The capacitance sensor 230, for example, may measure a capacitance value, based on an electric signal transferred from the electrode 210. Here, the capacitance sensor 230 may be referred to as, for example, a capacitive sensor, a capacitive touch sensor, a capacitive proximity sensor, or the like. The capacitance sensor 230 according to various embodiments of the disclosure is not limited to the mentioned terms, and any type of sensor that performs the same or similar function may be included in the capacitance sensor 230 according to various embodiments of the disclosure.

According to various embodiments, the control circuit 240 may control the switch 220 so as to electrically connect or disconnect the electrode 210 and the capacitance sensor 230.

The control circuit 240, for example, may measure a capacitance value using the capacitance sensor 230.

The control circuit 240, for example, may determine whether the electrode 210 and an external object are in contact (e.g., a state of wearing a wearable device on a wrist, a state of holding a mobile device, or the like), based on a capacitance value measured using the capacitance sensor 230. For example, the control circuit 240 may determine a threshold value which is a criterion for determining whether the electrode 210 and an external object are in contact, and may determine that the electrode 210 and the external object are in contact if the capacitance value measured using the capacitance sensor 230 is greater than or equal to the threshold value.

The control circuit 240, for example, may determine a capacitance value corresponding to the electrode 210, a capacitance value corresponding to an external object, and/or a threshold value, based on various capacitance values measured using the capacitance sensor 230. According to an embodiment, the control circuit 240 may determine a capacitance value arbitrarily set by a user for the electronic device 201, to be a threshold value.

The control circuit 240, for example, may refer to a component, such as the processor 120 included in the electronic device 101 of FIG. 1.

According to various embodiments, the electronic device 201 may further include a proximity sensor (e.g., the sensor module 176 of FIG. 1). The proximity sensor, for example, may include an optical proximity sensor that includes a light emitting unit and a light reception unit. The proximity sensor, for example, may detect the existence of an external object in a manner that detects, using the light reception unit, light which is emitted by the light emitting unit and is reflected by the external object. Here, the light emitting unit may include a light emitting diode (LED), and the light reception unit may include a photo diode (PD). The disclosure is not limited thereto. The proximity sensor may include various types of proximity sensors that use electromagnetic induction according to the detection principal, such as a high-frequency oscillation-type, a capacitance type, a magnetic type, and the like.

The control circuit 240, for example, may determine whether an external object which is close to the electronic device 201 exists, based on a sensor value measured using the proximity sensor. The control circuit 240, for example, may determine a threshold value, based on the existence of the external object, which is determined using the proximity sensor.

According to various embodiments, the electronic device 201 may further include a memory (not illustrated) (e.g., the memory 130 of FIG. 1). The memory, for example, may store data related to a capacitance value measured using the capacitance sensor 230. The memory, for example, may store data related to a threshold value which is a criterion for determining whether the electrode 210 is in contact with an external object. The memory, for example, may store data related to a capacitance value corresponding to the electrode 210, and/or a capacitance value corresponding to an external object.

Referring to FIG. 2B, the switch 220 may be disposed between the electrode 210 and the capacity sensor 230. The switch 220, for example, may electrically connect or disconnect the electrode 210 and the capacity sensor 230, according to the control of the control circuit 240. The switch 220 included in the electronic device 201, for example, may include an SPST switch. Although it is illustrated that the switch 220 includes an SPST switch in the embodiment, the disclosure is not limited to the embodiment. The disclosure may include various types of switches, such as a single pole, double throw (SPDT) switch, a double pole, single throw (DPST) switch, and the like.

The control circuit 240, for example, may measure a capacitance value using the capacitance sensor 230, and may determine whether the electrode 210 and an external object are in contact, based on the capacitance value measured using the capacitance sensor 230.

The electronic device 201 according to various embodiments of the disclosure may include: at least one electrode 210 having conductivity; a capacitance sensor 230; at least one switch 220 configured to be electrically connected between at least one electrode 210 and the capacitance sensor 230, and configured to selectively connect the at least one electrode 210 and the capacitance sensor 230; and a control circuit 240, wherein the control circuit 240 is configured to: measure a first capacitance value using the capacitance sensor 230 in the state in which the at least one switch 220 is open; measure a second capacitance value corresponding to an external object which is in contact with the at least one electrode 210, using the capacitance sensor 230, in the state in which the at least one switch 220 is connected; correct the second capacitance value using the first capacitance value; and determine the corrected second capacitance value to be a capacitance value for the external object.

In the electronic device 201 according to various embodiments of the disclosure, the control circuit 240 is configured to determine a threshold value for determining whether contact with the external object exists, based at least on the first capacitance value.

In the electronic device 201 according to various embodiments of the disclosure, the control circuit 240 is configured to determine the threshold value, based at least on a predetermined capacitance value corresponding to the at least one electrode 210.

In the electronic device 201 according to various embodiments of the disclosure, the control circuit 240 is configured to determine that the external object is in contact with the at least one electrode 210, if the second capacitance value is greater than or equal to the determined threshold value.

The electronic device 201 according to various embodiments of the disclosure may further include a proximity sensor, wherein the control circuit 240 is configured to:

measure a third capacitance value using the capacitance sensor 230 in the state in which the at least one switch 220 is connected, if contact with the external object is not detected using the proximity sensor; and determine a fourth capacitance value corresponding to the at least one electrode 210, based at least on the first capacitance value and the third capacitance value.

In the electronic device 201 according to various embodiments of the disclosure, the control circuit 240 is configured to determine a threshold value for determining whether contact with the external object exists, based at least on the first capacitance value and the fourth capacitance value.

In the electronic device 201 according to various embodiments of the disclosure, the control circuit 240 is configured to determine a threshold value for determining whether contact with the external object exists, based at least on a predetermined capacitance value corresponding to the at least one electrode 210, if contact with the external object is detected using the proximity sensor.

In the electronic device 201 according to various embodiments of the disclosure, the control circuit 240 is configured to determine a value obtained by subtracting the first capacitance value from the third capacitance value, to be the fourth capacitance value.

In the electronic device 201 according to various embodiments of the disclosure, the control circuit 240 is configured to determine a value obtained by adding the first capacitance value, a predetermined capacitance value corresponding to the at least one electrode 210, and a predetermined fifth capacitance value, to be the threshold value.

In the electronic device 201 according to various embodiments of the disclosure, the proximity sensor may include a light emitting diode and a photo diode.

Figure 3:
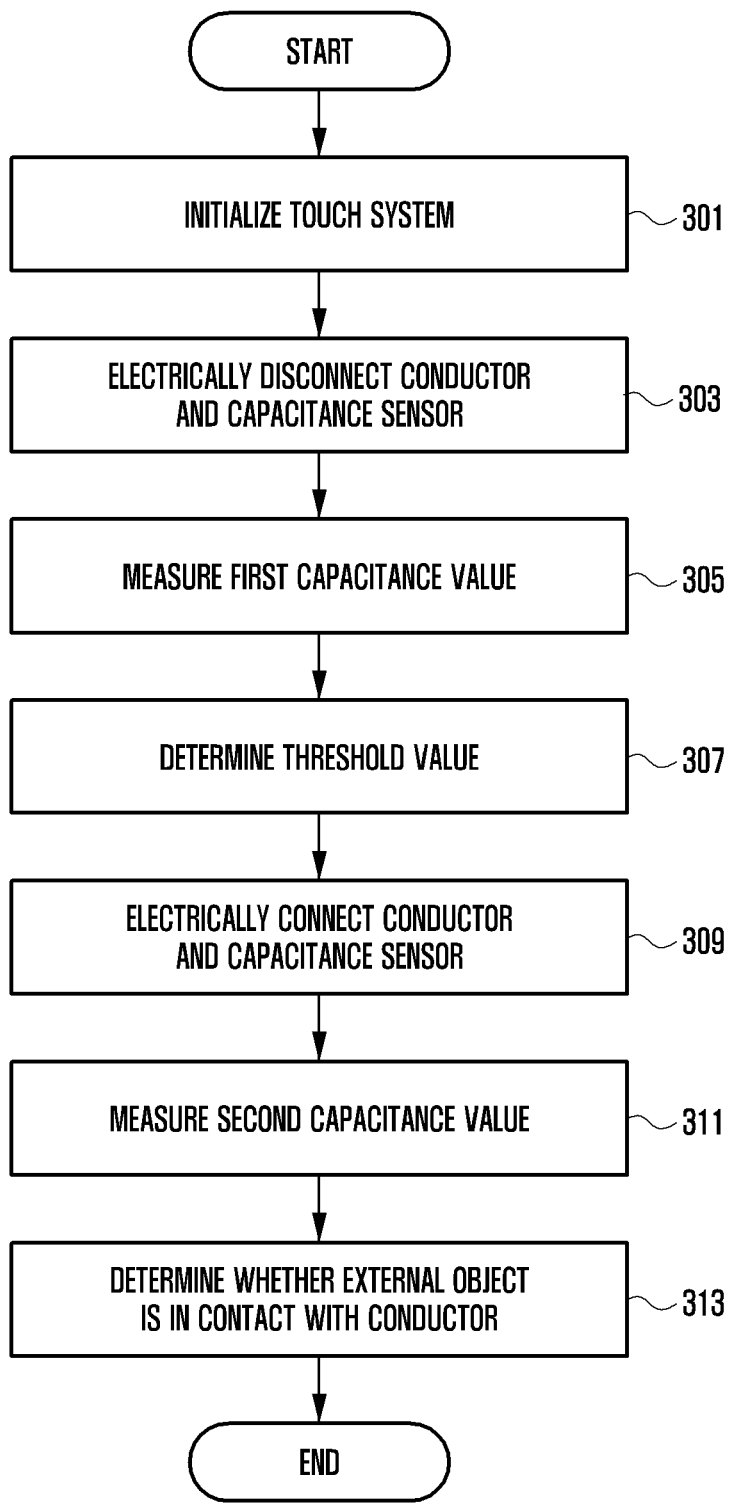
FIG. 3 is a flowchart illustrating a method of improving accuracy of measurement of a sensor of an electronic device according to various embodiments of the disclosure.

FIG. 3 is a flowchart illustrating a method of improving accuracy of measurement of a sensor of an electronic device according to various embodiments of the disclosure.

According to various embodiments, the electronic device 201 (e.g., the processor 120 of the electronic device 101 of FIG. 1 or the control circuit 240 of the electronic device 201 of FIGS. 2A and 2B) may initialize a touch system in operation 301. According to various embodiments, the touch system, for example, may refer to a component of the electronic device 201 and/or data stored in the electronic device 201 which may be related to determining whether the electrode 210 and an external object are in contact using the capacitance sensor 230. For example, if the power of the electronic device 201 is changed from a turned-off state to a turned-on state, the electronic device 201 may initialize the touch system. For example, the electronic device 201 may initialize the touch system according to a predetermined cycle. According to an embodiment, if the touch system of the electronic device 201 is initialized, the electronic device 201 may reset a threshold value which is a criterion for determining whether the electrode 210 and an external object are in contact with each other.

According to various embodiments, the electronic device 201 may electrically disconnect the electrode 210 and the capacitance sensor 230 in operation 303. The electronic device 201, for example, may control the switch 220 so that the electrode 210 and the capacity sensor 230 are electrically disconnected.

According to various embodiments, the electronic device 201 may measure a capacitance value using the capacitance sensor 230 in operation 305. According to an embodiment, the measured capacitance value, for example, may be a capacitance value measured based on an electric signal transferred from the components of the electronic device 201 which remain after excluding the electrode 210 and are electrically connected to the capacitance sensor 230.

According to various embodiments, the electronic device 201 may determine a threshold value which is a criterion for determining whether the electrode 210 and an external object are in contact with each other in operation 307. The electronic device 201, for example, may determine a threshold value based on the capacitance value measured in operation 305. For example, it is assumed that the capacitance value measured in operation 305 is about 50 pF, and a capacitance value corresponding to the electrode 210 is previously set to a value of about 5 pF. In this instance, the electronic device 201 may determine that a capacitance value measured when an external object is not in contact with the electrode 210 in the state in which the electrode 210 and the capacitance sensor 230 are electrically connected, is the same as a value of about 55 pF. In this instance, the electronic device 201 may determine a value obtained by adding a predetermined threshold set value and a value of about 55 pF, to be a threshold value. Here, the threshold set value, for example, may refer to a value which is less than the difference between a capacitance value measured when an external object is in contact with the electrode 210 and a capacitance value measured when the external object is not in contact with the electrode 210, in the state in which the electrode 210 and the capacitance sensor 230 are electrically connected. For example, if the predetermined threshold set value is about 15 pF, the electronic device 201 may determine the threshold value to be about 70 pF. According to an embodiment, the capacitance value corresponding to the electrode 210 and/or threshold set value may be arbitrarily set by a user for the electronic device 201.

According to various embodiments, the electronic device 201 may electrically connect the electrode 210 and the capacitance sensor 230 in operation 309. The electronic device 201, for example, may control the switch 220 so that the electrode 210 and the capacity sensor 230 are electrically connected.

According to various embodiments, the electronic device 201 may measure a capacitance value using the capacitance sensor 230 in operation 311. According to an embodiment, the measured capacitance value, for example, may be a capacitance value measured based on an electric signal transferred from the components of the electronic device 201 which include the electrode 210 and are electrically connected to the capacitance sensor 230.

According to various embodiments, the electronic device 201 may determine whether the electrode 210 is in contact with an external object in operation 313. For example, if the threshold value determined in operation 307 is about 70 pF, and the capacitance value measured in operation 311 is about 90 pF, the electronic device 201 may determine that the electrode 210 is in contact with an external object. According to an embodiment, the electronic device 201, for example, may obtain a capacitance value corresponding to the external object. For example, if the threshold value determined in operation 307 is about 70 pF, and the capacitance value measured in operation 311 is about 90 pF, the electronic device 201 may obtain the capacitance value corresponding to the external object to be about 20 pF.

Figure 4:
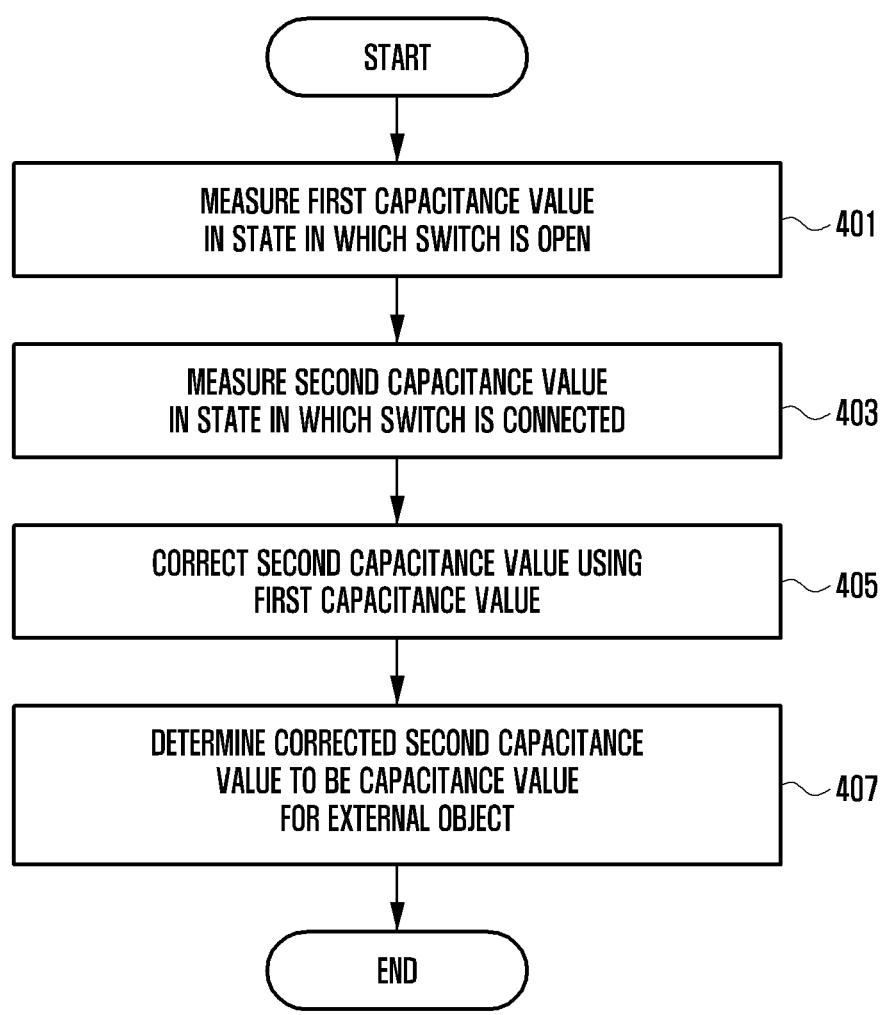
FIG. 4 is a flowchart illustrating a method of improving accuracy of measurement of a sensor of an electronic device according to various embodiments of the disclosure.

FIG. 4 is a flowchart illustrating a method of improving accuracy of measurement of a sensor of an electronic device according to various embodiments of the disclosure. A detailed description which overlaps the description which has been described with reference to FIG. 3 will be omitted.

According to various embodiments, the electronic device 201 (e.g., the processor 120 of the electronic device 101 of FIG. 1 or the control circuit 240 of the electronic device 201 of FIGS. 2A and 2B) may measure a capacitance value in the state in which the switch 220 is open in operation 401. The electronic device 201, for example, may control the switch 220 so as to electrically disconnect the electrode 210 and the capacitance sensor 230, and may determine a capacitance value, which is measured using the capacitance sensor 230 in the state in which the switch 220 is open, to be a first capacitance value.

According to various embodiments, the electronic device 201 may measure a capacitance value in the state in which the switch 220 is connected in operation 403. The electronic device 201, for example, may control the switch 220 so as to electrically connect the electrode 210 and the capacitance sensor 230, and may determine a capacitance value, which is measured using the capacitance sensor 230 in the state in which the switch 220 is connected, to be a second capacitance value.

According to various embodiments, the electronic device 201 may correct the second capacitance value measured in operation 403 using the first capacitance value measured in operation 401, in operation 405. The electronic device 201, for example, may subtract the total sum of the first capacitance value, a capacitance value corresponding to the electrode 210, and a threshold set value from the second capacitance value, and may determine the obtained value to be a corrected second capacitance value. According to an embodiment, the capacitance value corresponding to the electrode 210 and/or threshold set value may be arbitrarily set by a user for the electronic device 201. For example, if the measured first capacitance value is about 50 pF, the measured second capacitance value is about 90 pF, the capacitance value corresponding to the electrode 210 is about 5 pF, and the threshold set value is predetermined to be about 15 pF, the electronic device 201 may determine that the corrected second capacitance value is about 20 pF.

According to various embodiments, the electronic device 201 may determine the corrected second capacitance value to be a capacitance value for an external object in operation 407. The electronic device 201, for example, may determine a value of about 20 pF, which is obtained in operation 405, to be the capacitance value for the external object.

Figure 5:
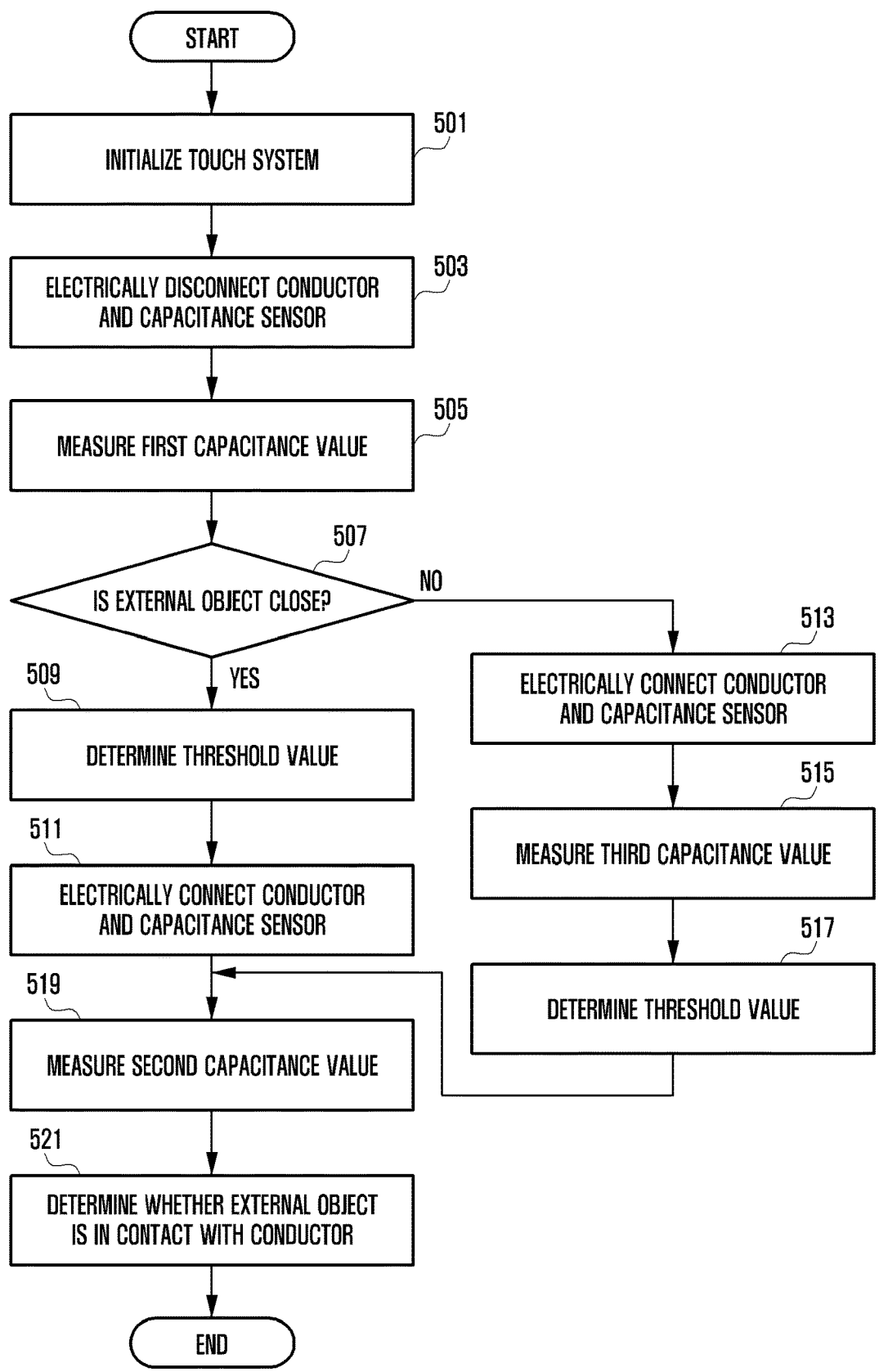
FIG. 5 is a flowchart illustrating a method of improving accuracy of measurement of a sensor of an electronic device according to various embodiments of the disclosure.

FIG. 5 is a flowchart illustrating a method of improving accuracy of measurement of a sensor of an electronic device according to various embodiments of the disclosure. A detailed description which overlaps the description which has been described with reference to FIGS. 3 and 4 will be omitted.

According to various embodiments, the electronic device 201 (e.g., the processor 120 of the electronic device 101 of FIG. 1 or the control circuit 240 of the electronic device 201 of FIGS. 2A and 2B) may initialize a touch system in operation 501. For example, if the power of the electronic device 201 is changed from a turned-off state to a turned-on state, the electronic device 201 may initialize the touch system. For example, the electronic device 201 may initialize the touch system according to a predetermined cycle. According to an embodiment, if the touch system of the electronic device 201 is initialized, the electronic device 201 may reset a threshold value which is a criterion for determining whether the electrode 210 is in contact with an external object.

According to various embodiments, the electronic device 201 may electrically disconnect the electrode 210 and the capacitance sensor 230 in operation 503. The electronic device 201, for example, may control the switch 220 so that the electrode 210 and the capacity sensor 230 are electrically disconnected.

According to various embodiments, the electronic device 201 may measure a first capacitance value using the capacitance sensor 230 in operation 505. According to an embodiment, the measured first capacitance value, for example, may be a capacitance value measured based on an electric signal transferred from the components of the electronic device 201 which remain after excluding the electrode 210 and are electrically connected to the capacitance sensor 230.

According to various embodiments, the electronic device 201 may determine whether an external object close to the electronic device 201 exists, using a proximity sensor in operation 507. For example, if the proximity sensor is an optical proximity sensor, the electronic device 201 may determine whether an external object close to the electronic device 201 exists, based on a sensor value measured in a manner that detects, using a light reception unit, light which is emitted from a light emitting unit of the proximity sensor and is reflected by the external object.

According to an embodiment, if it is determined that an external object exists close to the electronic device 201 in operation 507, the electronic device 201 may determine a threshold value which is a criterion for determining whether the electrode 210 is in contact with the external object, in operation 509. The electronic device, for example, may determine the threshold value based on the first capacitance value measured in operation 505. For example, if the first capacitance value measured in operation 505 is about 50 pF and a capacitance value corresponding to the electrode 210 is predetermined to be about 5 pF, the electronic device 201 may determine that a capacitance value, which is measured when the external object is not in contact with the electrode 210 in the state in which the electrode 210 and the capacitance sensor 230 are electrically connected, is the same as a value of about 55 pF. According to an embodiment, the electronic device 201 may determine a value obtained by adding a predetermined threshold set value to a value of about 55 pF, to be the threshold value. For example, if the predetermined threshold set value is about 15 pF, the electronic device 201 may determine the threshold value to be about 70 pF. According to an embodiment, the capacitance value corresponding to the electrode 210 and/or threshold set value may be arbitrarily set by a user for the electronic device 201.

According to various embodiments, the electronic device 201 may electrically connect the electrode 210 and the capacitance sensor 230 in operation 511. The electronic device 201, for example, may control the switch 220 so that the electrode 210 and the capacity sensor 230 are electrically connected.

According to various embodiments, if it is determined that an external object close to the electronic device 201 does not exist in operation 507, the electronic device 201 may electrically connect the electrode 210 and the capacitance sensor 230 in operation 513. The electronic device 201, for example, may control the switch 220 so that the electrode 210 and the capacity sensor 230 are electrically connected.

According to various embodiments, the electronic device 201 may measure a third capacitance value using the capacitance sensor 230 in operation 515. According to an embodiment, the measured third capacitance value, for example, may be a capacitance value measured based on an electric signal transferred from the components of the electronic device 201 which include the electrode 210 and are electrically connected to the capacitance sensor 230.

According to various embodiments, the electronic device 201 may determine a threshold value which is a criterion for determining whether the electrode 210 and an external object are in contact with each other in operation 517. The electronic device 201, for example, may determine the threshold value based on the first capacitance value measured in operation 505 and the third capacitance value measured in operation 515. For example, if the first capacitance value measured in operation 505 is about 50 pF, and the third capacitance value measured in operation 515 is about 57 pF, the electronic device 201 may determine that a capacitance value corresponding to the electrode 210 is about 7 pF. The electronic device 201, for example, may determine that a capacitance value, measured when an external object is not in contact with the electrode 210 in the state in which the electrode 210 and the capacitance sensor 230 are electrically connected, is the same value as a value of about 57 pF. According to an embodiment, the electronic device 201 may determine a value obtained by adding a predetermined threshold set value to a value of about 57 pF, to be the threshold value. For example, if the predetermined threshold set value is about 15 pF, the electronic device 201 may determine the threshold value to be about 72 pF. According to an embodiment, the threshold set value may be arbitrarily set by a user for the electronic device 201.

According to various embodiments, the electronic device 201 may measure a second capacitance value using the capacitance sensor 230 in operation 519. According to an embodiment, the measured capacitance value, for example, may be a capacitance value measured based on an electric signal transferred from the components of the electronic device 201 which include the electrode 210 and are electrically connected to the capacitance sensor 230.

According to various embodiments, the electronic device 201 may determine whether the electrode 210 is in contact with an external object in operation 521. The electronic device 201, for example, may compare the second capacitance value measured in operation 519 and the threshold value determined in operation 509 or operation 517, so as to determine whether the electrode 210 is in contact with an external object. For example, if the threshold value determined in operation 509 is about 70 pF, and the second capacitance value measured in operation 519 is about 57 pF, the electronic device 201 may determine that the electrode 210 and an external object are not in contact with each other. According to an embodiment, if the threshold value determined in operation 517 is about 72 pF, and the second capacitance value measured in operation 519 is about 90 pF, the electronic device 201 may determine that the electrode 210 and an external object are in contact with each other. According to an embodiment, the electronic device 201 may obtain a capacitance value corresponding to the external object. For example, if the threshold value determined in operation 517 is about 72 pF, and the second capacitance value measured in operation 519 is about 90 pF, the electronic device 201 may obtain the capacitance value corresponding to the external object to be about 18 pF.

Therefore, the electronic device 201 may accurately obtain the capacitance value corresponding to the electrode 210 using the proximity sensor, and may accurately determine the threshold value which is a criterion for determining whether the electrode 210 and an external object are in contact with each other.

A method of correcting a measurement value of a sensor of the electronic device 201 according to various embodiments of the disclosure may include: measuring a first capacitance value using the capacitance sensor 230 of the electronic device 201 in the state in which at least one switch 220 of the electronic device 201 is open; measuring a second capacitance value corresponding to an external object that is in contact with the at least one electrode 210 of the electronic device 201 which has connectivity, using the capacitance sensor 230 in the state in which the at least one switch 220 is connected; correcting the second capacitance value using the first capacitance value; and determining the corrected second capacitance value to be a capacitance value for the external object.

The method of correcting the measurement value of the sensor of the electronic device 201 according to various embodiments of the disclosure may further include determining a threshold value for determining whether contact with the external object exists, based at least on the first capacitance value.

In the method of correcting the measurement value of the sensor of the electronic device 201 according to various embodiments of the disclosure, the operation of determining the threshold value may further include determining the threshold value, based at least on a predetermined capacitance value corresponding to the at least one electrode 210.

The method of correcting the measurement value of the sensor of the electronic device 201 according to various embodiments of the disclosure may further include determining that the external object is in contact with the at least one electrode 210, if the second capacitance value is greater than or equal to the determined threshold value.

The method of correcting the measurement value of the sensor of the electronic device 201 according to various embodiments of the disclosure may further include: measuring a third capacitance value using the capacitance sensor 230 in the state in which the at least one switch 220 is connected, if contact with the external object is not detected using the proximity sensor of the electronic device 201; and determining a fourth capacitance value corresponding to the at least one electrode 210, based at least on the first capacitance value and the third capacitance value.

The method of correcting the measurement value of the sensor of the electronic device 201 according to various embodiments of the disclosure may further include determining the threshold value, used for determining whether contact with the external object exists, based at least on the first capacitance value and the fourth capacitance value.

The method of correcting the measurement value of the sensor of the electronic device 201 according to various embodiments of the disclosure may further include determining the threshold value, used for determining whether contact with the external object exists, based at least on a predetermined capacitance value corresponding to the at least one electrode 210, if contact with the external object is detected using the proximity sensor.

In the method of correcting the measurement value of the sensor of the electronic device 201 according to various embodiments of the disclosure, the operation of determining the fourth capacitance value may further include determining a value obtained by subtracting the first capacitance value from the third capacitance value to be the fourth capacitance value.

In the method of correcting the measurement value of the sensor of the electronic device 201 according to various embodiments of the disclosure, the operation of determining the threshold value may further include determining the threshold value by adding the first capacitance value, a predetermined capacitance value corresponding to the at least one electrode 210, and a predetermined fifth capacitance value.

A computer readable storage medium stores instructions, wherein the instructions are configured to enable at least one processor (e.g., the processor 120 of FIG. 1 or the control circuit 240 of FIGS. 2A and 2B) of an electronic device (e.g., the electronic device 101 of FIG. 1 or the electronic device 201 of FIGS. 2A and 2B) to perform at least one operation when the instructions are executed by the at least one processor, the at least one operation including: measuring a first capacitance value using the capacitance sensor 230 in the state in which at least one switch 220 is open, the switch being capable of selectively connecting the at least one electrode 210 having conductivity and the capacitance sensor 230 of the electronic device 201; measuring a second capacitance value corresponding to an external object that is in contact with the at least one electrode 210, using the capacitance sensor 230, in the state in which the at least one switch 220 is connected; correcting the second capacitance value using the first capacitance value; and determining the corrected second capacitance value to be a capacitance value for the external object.

Figure 6A:
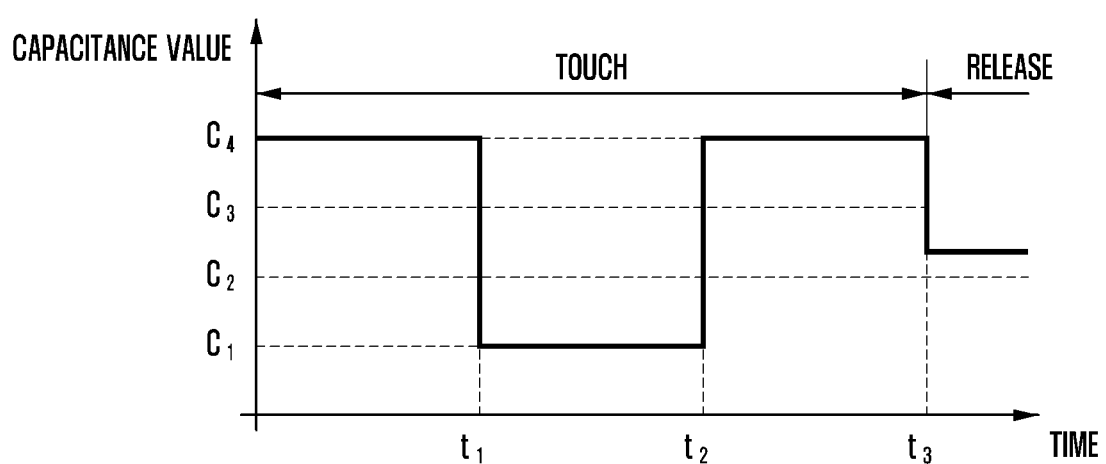
FIGS. 6A to 6C are diagrams illustrating examples of a capacitance value which is measured using a capacitance sensor of an electronic device according to various embodiments of the disclosure.
Figure 6B:
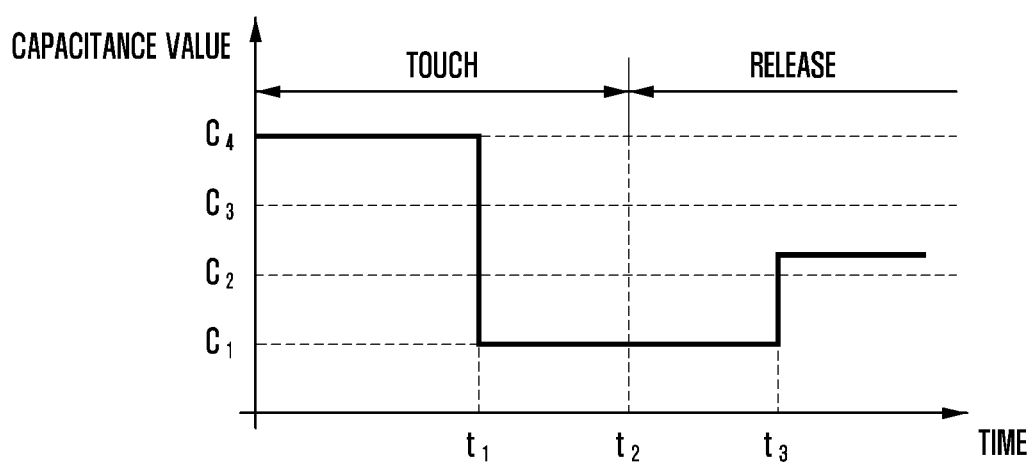
Figure 6C:
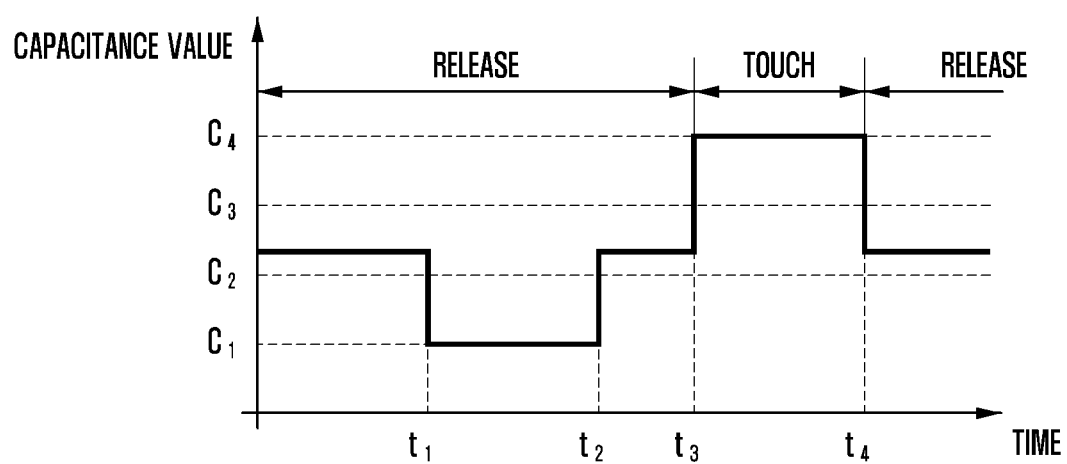

FIGS. 6A to 6C are diagrams illustrating examples of a capacitance value which is measured by a capacitance sensor of an electronic device according to various embodiments of the disclosure.

Referring to FIG. 6A, it is identified that an external object is in contact with the electrode 210 during a period before t1 to t3, and the external object is not in contact with the electrode 210 after t3. Also, it is identified that a capacitance value that the electronic device 201 measures using the capacitance sensor 230 before t1 is C4.

The electronic device 201 may initialize a touch system at t1. In this instance, irrespective of whether the electrode 210 and an external object are in contact with each other at the point at which the touch system is initialized, if the touch system is initialized, the electronic device 201 may control the switch 220 so as to electrically disconnect the electrode 210 and the capacitance sensor 230. The electronic device 201, for example, may electrically disconnect the electrode 210 and the capacitance sensor 230 at t1, and may measure a capacitance value. Therefore, a capacitance value, which is measured based on an electric signal transferred to the capacitance sensor 230 from the components of the electronic device 201, excluding the electrode 210, is identified as C1, and C1 is measured in the period from t1 to t2, which is a regular capacitance value irrespective of whether the electrode 210 and an external object are in contact with each other.

The electronic device 201, for example, may determine a threshold value, which is a criterion for determining whether the electrode 210 is in contact with an external object, to be C3. According to an embodiment, the electronic device 201 may determine a value obtained by adding C1, which is a capacitance value measured based on an electric signal transferred to the capacitance sensor 230 from the components of the electronic device 201 remaining after excluding the electrode 210, to a predetermined capacitance value corresponding to the electrode 210, to be a capacitance value C2, and may determine a value obtained by adding C2 and a predetermined threshold set value to be C3 which is a threshold value used as a criterion for determining whether the electrode 210 and an external object are in contact. According to an embodiment, the capacitance value corresponding to the electrode 210 and/or the threshold set value may be arbitrarily set by a user.

The electronic device 201, for example, may electrically connect the electrode 210 and the capacitance sensor 230 after t2, and may measure a capacitance value. In this instance, it is identified that a capacitance value measured using the capacitance sensor 230 during the period from t2 before t3 is C4, and the electronic device 201 may compare C4 and C3, and may determine that the electrode 210 and an external object are in contact with each other. For example, if a capacitance value measured using the capacitance sensor 230 is greater than C3, the electronic device 201 may determine that the electrode 210 and an external object are in contact with each other.

According to various embodiments, it is illustrated that the capacitance value measured before t1 and a capacitance value measured from t2 before t3 are the same as C4. However, C4 may be an example of a capacitance value measured using the capacitance sensor 230 when the electrode 210 is in contact with an external object, and may be a capacitance value measured differently depending on the type of external object.

The electronic device 201 compares C3 and a capacitance value measured after t3 using the capacitance sensor 230, and may determine that the electrode 210 and an external object are not in contact with each other. For example, if the capacitance value measured using the capacitance sensor 230 is greater than C2 and less than C3, the electronic device 201 may determine that the electrode 210 and an external object are not in contact with each other.

According to an embodiment, a capacitance value corresponding to the electrode 210, set in advance for the electronic device 201, for example, may be a value that is arbitrarily set by a user for the electronic device 201, in order to determine whether the electrode 210 is in contact with an external object. In this instance, the capacitance value corresponding to the electrode 210 which is set in advance for the electronic device 201 may not be identical to the actual capacitance value of the electrode 210 which is actually included in the electronic device 201. Therefore, the capacitance sensor value measured after t3 at which the electrode 210 and an external electronic device are not in contact with each other may not be identical to the capacitance value C2. According to an embodiment, a capacitance value measured from t3 may refer to an example of a capacitance value measured using the capacitance sensor 230 when the electrode 210 is not in contact with an external object, and the capacitance value may be measured differently depending on the states of components included in the electronic device 201.

Referring to FIG. 6B, it is identified that an external object is in contact with the electrode 210 during the period before t1 to t2, and the external object is not in contact with the electrode 210 after t2. Also, it is identified that a capacitance value that the electronic device 201 measures using the capacitance sensor 230 before t1 is C4.

The electronic device 201 may initialize a touch system at t1. In this instance, irrespective of whether the electrode 210 and an external object are in contact with each other at the point at which the touch system is initialized, if the touch system is initialized, the electronic device 201 may electrically disconnect the electrode 210 and the capacitance sensor 230.

The electronic device 201, for example, may electrically disconnect the electrode 210 and the capacitance sensor 230 at t1, and may measure a capacitance value C1. According to an embodiment, the electronic device 201 may determine a threshold value, which is a criterion for determining whether the electrode 210 and an external object are in contact with each other, to be C3.

The electronic device 201, for example, may electrically connect the electrode 210 and the capacitance sensor 230 after t3, and may measure a capacitance value. For example, if the capacitance value measured using the capacitance sensor 230 after t3 is greater than C2 and less than C3, the electronic device 201 may determine that the electrode 210 and an external object are not in contact with each other. According to an embodiment, the capacitance value measured from t3 may refer to an example of a capacitance value measured using the capacitance sensor 230 when the electrode 210 is not in contact with an external object, and the capacitance value may be measured differently depending on the states of components included in the electronic device 201.

Referring to FIG. 6C, it is identified that the electrode 210 and an external object are not in contact with each other during the period before t1 to t3, it is identified that the electrode 210 and an external object are in contact with each other from t3 to t4, and it is identified that the electrode 210 and an external object are not in contact after t4.

According to an embodiment, it is identified that a capacitance value that the electronic device 201 measures using the capacitance sensor 230 before t1 is greater than C2 and less than C3.

The electronic device 201 may initialize a touch system at t1. In this instance, irrespective of whether the electrode 210 and an external object are in contact with each other at the point at which the touch system is initialized, if the touch system is initialized, the electronic device 201 may electrically disconnect the electrode 210 and the capacitance sensor 230.

The electronic device 201, for example, may electrically disconnect the electrode 210 and the capacitance sensor 230 at t1, and may measure a capacitance value C1. According to an embodiment, the electronic device 201 may determine a threshold value, which is a criterion for determining whether the electrode 210 and an external object are in contact with each other, to be C3.

The electronic device 201, for example, may electrically connect the electrode 210 and the capacitance sensor 230 after t2, and may measure a capacitance value. For example, if the capacitance value measured using the capacitance sensor 230 during the period after t2 to t3 is greater than C2 and less than C3, the electronic device 201 may determine that the electrode 210 and an external object are not in contact with each other.

For example, if a capacitance value measured using the capacitance sensor 230 during the period after t3 to t4 is greater than C3, the electronic device 201 may determine that the electrode 210 and an external object are in contact with each other.

For example, if the capacitance value measured using the capacitance sensor 230 after t4 is greater than C2 and less than C3, the electronic device 201 may determine that the electrode 210 and an external object are not in contact with each other.

Figure 7:
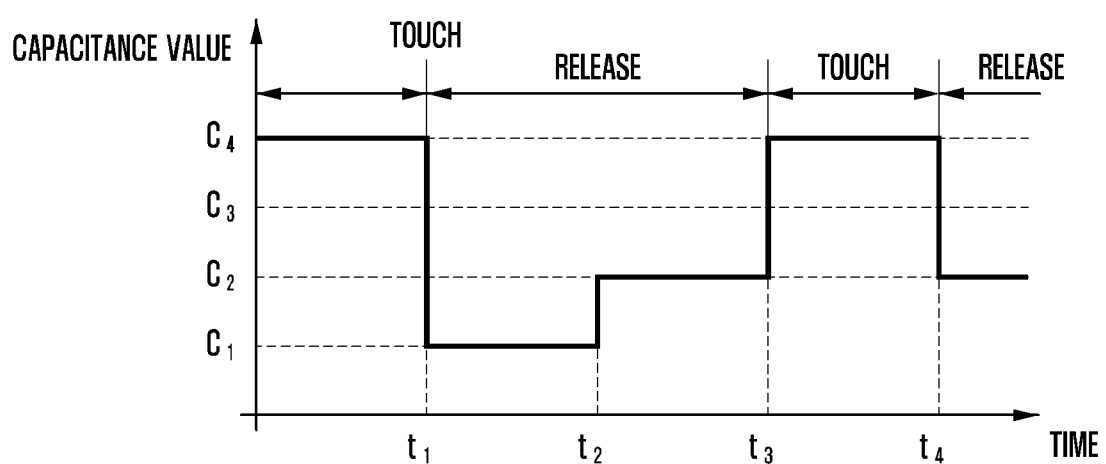
FIG. 7 is a diagram illustrating an example of a capacitance value which is measured using a capacitance sensor of an electronic device according to various embodiments of the disclosure.

FIG. 7 is a diagram illustrating an example of a capacitance value which is measured by a capacitance sensor of an electronic device according to various embodiments of the disclosure.

FIG. 7 is a diagram illustrating an example of a capacitance value measured using the capacitance sensor 230 when the electronic device 201 determines, using a proximity sensor, that an external object close to the electronic device does not exist. A detailed description which overlaps the description which has been described with reference to FIGS. 6A to 6C will be omitted.

Referring to FIG. 7, it is identified that the electrode 210 and an external object are in contact with each other before t1, and the electrode 210 and an external object are not in contact with each other during the period after t1 before t3. Also, it is identified that the electrode 210 and an external object are in contact with each other from t3 before t4, and the electrode 210 and an external object are not in contact with each other after t4. Also, it is identified that a capacitance value that the electronic device 201 measures using the capacitance sensor 230 before t1 is C4.

The electronic device 201 may initialize a touch system at t1. In this instance, irrespective of whether the electrode 210 and an external object are in contact with each other at the point at which the touch system is initialized, if the touch system is initialized, the electronic device 201 may electrically disconnect the electrode 210 and the capacitance sensor 230. The electronic device 201, for example, may electrically disconnect the electrode 210 and the capacitance sensor 230 at t1, and may measure a capacitance value. Therefore, a capacitance value, which is measured based on an electric signal transferred to the capacitance sensor 230 from the components of the electronic device 201 remaining after excluding the electrode 210, is identified as C1, and C1 may be measured in the period from t1 to t2, which is a regular capacitance value irrespective of whether the electrode 210 and an external object are in contact with each other.

If the electronic device 201 determines that an external object close to the electronic device 201 does not exist during the period between t1 and t2 using a proximity sensor, the electronic device 201, for example, may electrically connect the electrode 210 and the capacitance sensor 230 and may measure a capacitance value after t2. According to an embodiment, if the electronic device 201 determines, using the proximity sensor, that an external object close to the electronic device 201 exists during the period between t1 and t2, the electronic device 201 may determine C3 which is a threshold value used as a criterion for determining whether the electrode 210 and an external object are in contact with each other, based on a predetermined capacitance value corresponding to the electrode 210, as illustrated in FIG. 6A.

According to an embodiment, if the electronic device 201 determines, using the proximity sensor, that an external object close to the electronic device 201 does not exist, the electronic device 201 may determine a capacitance value corresponding to the difference between C1 and C2, which is measured using the capacitance sensor 230 during the period from t2 before t3, to be a capacitance value corresponding to the electrode 210 which is used for determining a threshold value used as a criterion for determining whether the electrode 210 and an external object are in contact with each other. Therefore, the electronic device 201, for example, may determine a value obtained by adding a predetermined threshold set value to C2, which is the capacitance value measured using the capacitance sensor 230 during the period from t2 before t3, to be C3 which is a threshold value used as a criterion for determining whether the electrode 210 and an external object are in contact with each other. According to an embodiment, the threshold set value may be arbitrarily set by a user.

According to an embodiment, it is identified that a capacitance value measured using the capacitance sensor 230 during the period from t3 before t4 is C4, and the electronic device 201 may compare C4 and C3, and may determine that the electrode 210 and an external object are in contact with each other. For example, if a capacitance value measured using the capacitance sensor 230 is greater than C3, the electronic device 201 may determine that the electrode 210 and an external object are in contact with each other. According to various embodiments, it is illustrated that the capacitance value measured before t1 and the capacitance value measured from t2 before t3 is the same value as C4. However, C4 may be an example of a capacitance value measured using the capacitance sensor 230 when the electrode 210 is in contact with an external object, and may be a capacitance value measured differently depending on the type of external object.

The electronic device 201, for example, compares C3 and a capacitance value measured using the capacitance sensor 230 after t4, and may determine that the electrode 210 and an external object are not in contact with each other. For example, if the capacitance value measured using the capacitance sensor 230 is greater than C2 and less than C3, the electronic device 201 may determine that the electrode 210 and an external object are not in contact with each other. According to an embodiment, a capacitance value measured after t4 may be an example of a capacitance value measured using the capacitance sensor 230 when the electrode 210 is not in contact with an external object, and the capacitance value may be measured differently depending on the states of components included in the electronic device 201.

The embodiments of the disclosure in the specification and drawings are merely examples provided to easily describe the technical idea of the embodiments of the disclosure and to help understanding of the embodiments of the disclosure, and may not limit the scope of the embodiments of the disclosure. Therefore, it is understood that the scope of the various embodiments of the disclosure includes all changes and modifications drawn based on the technical idea of the various embodiments of the disclosure, in addition to the embodiments disclosed herein.

The invention claimed is:

1. An electronic device, comprising:
   at least one electrode having conductivity;
   a capacitance sensor;
   at least one switch configured to be electrically connected between the at least one electrode and the capacitance sensor, the at least one switch being configured to selectively connect the at least one electrode to the capacitance sensor;
   a proximity sensor; and
   a control circuit, wherein the control circuit is configured to:
   initialize a touch system related to determining whether the at least one electrode and an external object are in contact using the capacitance sensor,
   measure a first capacitance value using the capacitance sensor in a state in which the at least one switch is open,
   determine whether the external object close to the electronic device exists, using the proximity sensor,
   based on determining that the external object exists close to the electronic device, determine a threshold value for determining whether the at least one electrode is in contact with the external object, based on the first capacitance value,
   electrically connect the at least one electrode and the capacitance sensor by controlling the at least one switch,
   measure a second capacitance value corresponding to the external object which is in contact with the at least one electrode, using the capacitance sensor, in a state in which the at least one switch is connected,
   correct the second capacitance value using the first capacitance value and the threshold value,
   determine the corrected second capacitance value to be a capacitance value for the external object, and
   determine whether the at least one electrode is in contact with the external object, based on the corrected second capacitance value and the threshold value.

2. The electronic device as claimed in claim 1, wherein the control circuit is configured to determine the threshold value, based at least on a predetermined capacitance value corresponding to the at least one electrode.

3. The electronic device as claimed in claim 2, wherein the control circuit is configured to determine that the external object is in contact with the at least one electrode, based on the second capacitance value being greater than or equal to the determined threshold value.

4. The electronic device as claimed in claim 1, wherein the control circuit is configured to:
   measure a third capacitance value using the capacitance sensor in a state in which the at least one switch is connected, based on contact with the external object not being detected using the proximity sensor, and
   determine a fourth capacitance value corresponding to the at least one electrode, based at least on the first capacitance value and the third capacitance value.

5. The electronic device as claimed in claim 4, wherein the control circuit is configured to determine the threshold value for determining whether contact with the external object exists, based at least on the first capacitance value and the fourth capacitance value.

6. The electronic device as claimed in claim 4, wherein the control circuit is configured to determine the threshold value for determining whether contact with the external object exists, based at least on a predetermined capacitance value corresponding to the at least one electrode, based on contact with the external object being detected using the proximity sensor.

7. The electronic device as claimed in claim 4, wherein the control circuit is configured to determine a value obtained by subtracting the first capacitance value from the third capacitance value, to be the fourth capacitance value.

8. The electronic device as claimed in claim 2, wherein the control circuit is configured to determine a value obtained by adding the first capacitance value, the predetermined capacitance value corresponding to the at least one electrode, and a predetermined fifth capacitance value, to be the threshold value.

9. A method of correcting a measurement value of a sensor of an electronic device, the method comprising:
   initializing a touch system related to determining whether at least one electrode and an external object are in contact using a capacitance sensor;
   measuring a first capacitance value using the capacitance sensor, in a state in which at least one switch is open, the at least one switch being capable of selectively connecting the at least one electrode and the capacitance sensor;
   determining that the external object close to the electronic device exists, using a proximity sensor;
   based on determining that the external object exists close to the electronic device, determining a threshold value for determining whether the at least one electrode is in contact with the external object, based on the first capacitance value;

electrically connecting the at least one electrode and the capacitance sensor by controlling the at least one switch;

measuring a second capacitance value corresponding to the external object that is in contact with the at least one electrode, using the capacitance sensor, in a state in which the at least one switch is connected;

correcting the second capacitance value using the first capacitance value and the threshold value;

determining the corrected second capacitance value to be a capacitance value for the external object; and determining whether the at least one electrode is in contact with the external object, based on the corrected second capacitance value and the threshold value.

10. The method as claimed in claim 9, wherein the determining the threshold value comprises:

determining the threshold value, based at least on a predetermined capacitance value corresponding to the at least one electrode; and determining that the external object is in contact with the at least one electrode, based on the second capacitance value being greater than or equal to the determined threshold value.

11. The method as claimed in claim 9, further comprising:

measuring a third capacitance value using the capacitance sensor in a state in which the at least one switch is connected, based on contact with the external object not being detected using the proximity sensor of the electronic device; and determining a fourth capacitance value corresponding to the at least one electrode, based at least on the first capacitance value and the third capacitance value, wherein the determining the threshold value comprises:

determining the threshold value based at least on the first capacitance value and the fourth capacitance value;

determining the threshold value based at least on a predetermined capacitance value corresponding to the at least one electrode, based on contact with the external object being detected using the proximity sensor; or determining the threshold value by adding the first capacitance value, the predetermined capacitance value corresponding to the at least one electrode, and a predetermined fifth capacitance value.

12. The method as claimed in claim 11, wherein the determining the fourth capacitance value further comprises:

determining a value obtained by subtracting the first capacitance value from the third capacitance value to be the fourth capacitance value.

13. A non-transitory computer readable storage medium storing instructions, wherein the instructions are configured to enable at least one processor of an electronic device to perform at least one operation when the instructions are executed by the at least one processor, the at least one operation comprising:

initializing a touch system related to determining whether at least one electrode and an external object are in contact using a capacitance sensor;

measuring a first capacitance value using the capacitance sensor in a state in which at least one switch is open, the at least one switch being capable of selectively connecting the at least one electrode having conductivity and the capacitance sensor of the electronic device;

determining whether the external object close to the electronic device exists, using a proximity sensor;

based on determining that the external object exists close to the electronic device, determining a threshold value for determining whether the at least one electrode is in contact with the external object, based on the first capacitance value;

electrically connecting the at least one electrode and the capacitance sensor by controlling the at least one switch;

measuring a second capacitance value corresponding to the external object that is in contact with the at least one electrode, using the capacitance sensor, in a state in which the at least one switch is connected;

correcting the second capacitance value using the first capacitance value and the threshold value;

determining the corrected second capacitance value to be a capacitance value for the external object; and determining whether the at least one electrode is in contact with the external object, based on the corrected second capacitance value and the threshold value.

* * * * *